United States Patent
Yoshikawa et al.

(10) Patent No.: US 11,521,885 B2
(45) Date of Patent: Dec. 6, 2022

(54) SUBSTRATE FIXING DEVICE

(71) Applicant: SHINKO ELECTRIC INDUSTRIES CO., LTD., Nagano (JP)

(72) Inventors: Tadayoshi Yoshikawa, Nagano (JP); Miki Saito, Nagano (JP); Takahiko Suzuki, Nagano (JP); Shuzo Aoki, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 404 days.

(21) Appl. No.: 16/812,503

(22) Filed: Mar. 9, 2020

(65) Prior Publication Data
US 2020/0294838 A1  Sep. 17, 2020

(30) Foreign Application Priority Data

Mar. 12, 2019 (JP) .............................. JP2019-044859

(51) Int. Cl.
| | |
|---|---|
| *H01L 21/683* | (2006.01) |
| *H01J 37/32* | (2006.01) |
| *C23C 16/46* | (2006.01) |
| *H01L 21/67* | (2006.01) |

(52) U.S. Cl.
CPC ........ *H01L 21/6833* (2013.01); *C23C 16/466* (2013.01); *H01J 37/32724* (2013.01); *H01L 21/683* (2013.01); *H01J 2237/2001* (2013.01); *H01J 2237/334* (2013.01); *H01L 21/67069* (2013.01)

(58) Field of Classification Search
CPC .............. H01L 21/6833; H01L 21/683; H01L 21/67069; H01L 21/67109; H01L 21/6831; H01L 21/68785; H01J 37/32724; H01J 2237/2001; H01J 2237/334; H01J 37/32715; C23C 16/466
USPC .......................................... 361/234
See application file for complete search history.

(56) References Cited

U.S. PATENT DOCUMENTS

2019/0131163 A1* 5/2019 Kuno ................ H01L 21/67103

FOREIGN PATENT DOCUMENTS

WO        2018/216797        11/2018

* cited by examiner

*Primary Examiner* — Dharti H Patel
(74) *Attorney, Agent, or Firm* — IPUSA, PLLC

(57) ABSTRACT

A substrate fixing device includes a base plate including therein a gas supply section, and an electrostatic chuck provided on the base plate. The electrostatic chuck includes a base having a mounting surface on which a target to be held by electrostatic attraction is mounted, an insertion hole, penetrating the base, having an inner surface that defines the insertion hole and is threaded to form a female thread, and a screw member, having an outer surface that is threaded to form a male thread, and inserted into the insertion hole to assume a mated state in which the male thread mates with the female thread. A gas from the gas supply section is supplied to the mounting surface via the screw member.

16 Claims, 8 Drawing Sheets

SUBSTRATE FIXING DEVICE

CROSS-REFERENCE TO RELATED APPLICATION

This application is based upon and claims priority to Japanese Patent Application No. 2019-044859, filed on Mar. 12, 2019, the entire contents of which are incorporated herein by reference.

FIELD

Certain aspects of the embodiments discussed herein are related to a substrate fixing device.

BACKGROUND

Conventionally, film forming apparatuses (for example, chemical vapor deposition (CVD) apparatuses, physical vapor deposition (PVD) apparatuses, or the like) and plasma etching apparatuses, that are used when manufacturing semiconductor devices such as integrated circuits (ICs), large scale integrated circuits (LSIs), or the like, include a stage configured to accurately hold a wafer inside a vacuum chamber.

As an example of such a stage, there is a proposed substrate fixing device that holds the wafer, which is an example of a target to be held, by electrostatic attraction, using a electrostatic chuck that is mounted on a base plate, for example. An example of the substrate fixing device may have a structure including a gas supply section for cooling the wafer. The gas supply section supplies a gas to a surface of the electrostatic chuck, via a gas passage inside the base plate, and a gas exhaust section (through-holes) provided in the electrostatic chuck.

An example of a susceptor for the wafer is described in International Publication WO 2018/216797 A1 (now Japanese Patent No. 6420937), for example.

When using the substrate fixing device in the plasma etching apparatus, there is a problem in that an abnormal discharge, that is transmitted through the gas supply section of the electrostatic chuck during a wafer etching process, may be generated, to thereby cause damage to the wafer and/or the plasma etching apparatus itself.

As countermeasures against the abnormal discharge, there are studies to reduce the diameter of the gas exhaust section. However, when the diameter of the gas exhaust section is reduced, the gas exhaust section is easily be blocked by byproducts or the like of the etching. Because it is extremely difficult to remove the byproducts or the like of the etching that blocks the gas exhaust section, it becomes difficult to provide easy maintenance of the substrate fixing device. Consequently, the countermeasures against the abnormal discharge are not practical solutions.

SUMMARY

Accordingly, it is an object in one aspect of the embodiments to provide a substrate fixing device employing countermeasures against the abnormal discharge that enable easy maintenance.

According to one aspect of the embodiments, a substrate fixing device includes a base plate including therein a gas supply section; and an electrostatic chuck provided on the base plate, wherein the electrostatic chuck includes a base having a mounting surface on which a target to be held by electrostatic attraction is mounted, an insertion hole, penetrating the base, having an inner surface that defines the insertion hole and is threaded to form a female thread, and a first screw member, having an outer surface that is threaded to form a male thread, and inserted into the insertion hole to assume a mated state in which the male thread mates with the female thread, wherein a gas from the gas supply section is supplied to the mounting surface via the first screw member.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

DESCRIPTION OF EMBODIMENTS

Figure 1A:
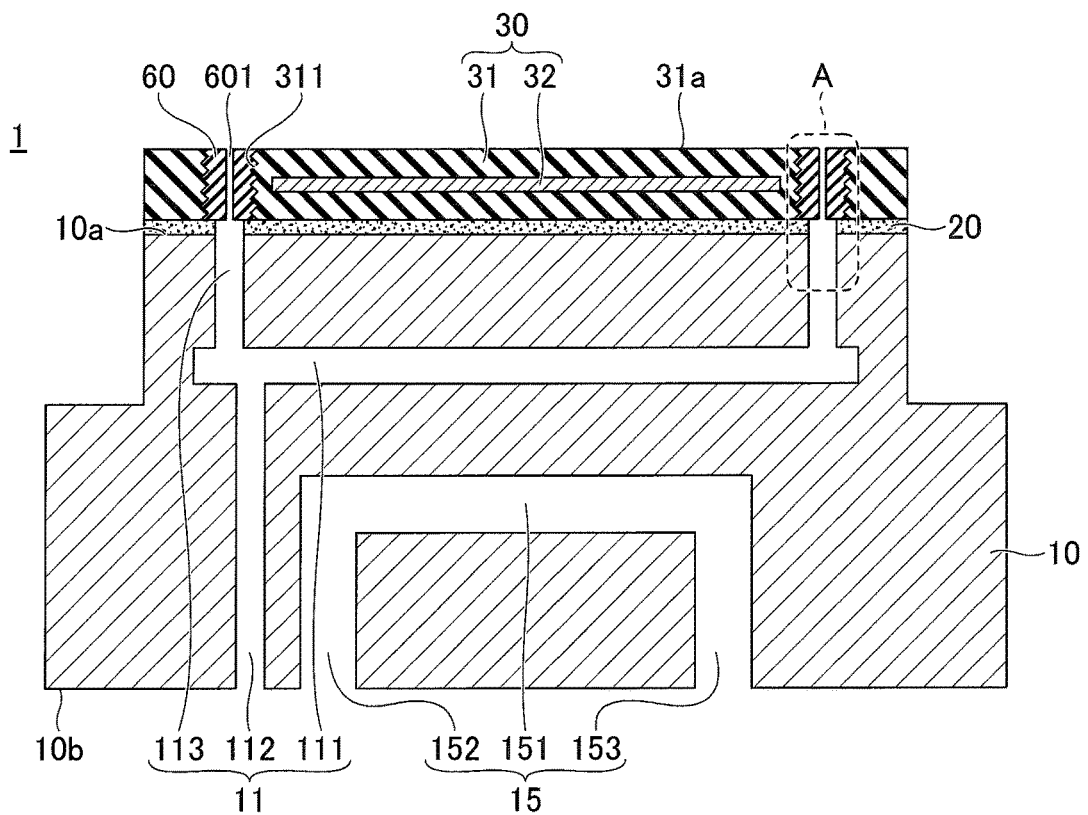
FIG. 1A and FIG. 1B are cross sectional views schematically illustrating an example of a substrate fixing device according to a first embodiment.

Preferred embodiments of the present invention will be described with reference to the accompanying drawings. In the drawings, those constituent parts that are the same are designated by the same reference numerals, and a repeated description of the same constituent parts may be omitted.

First Embodiment

Figure 1B:
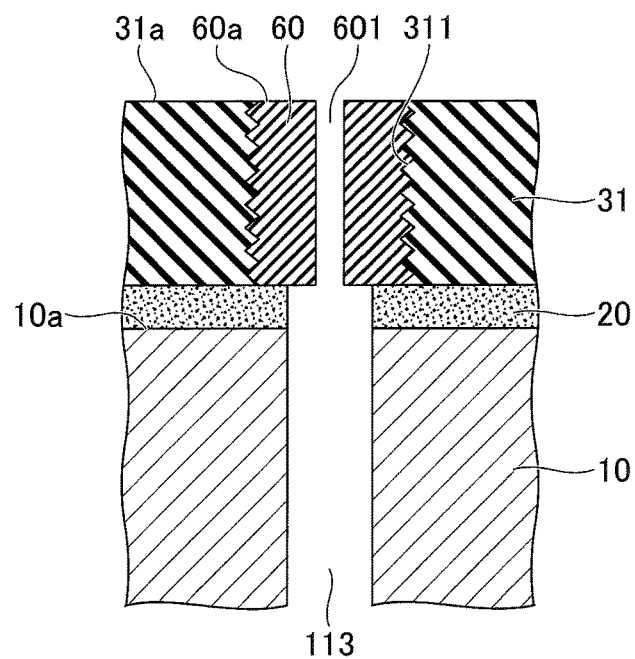

FIG. 1A and FIG. 1B are cross sectional views schematically illustrating an example of a substrate fixing device according to a first embodiment. FIG. 1A illustrates the entire substrate fixing device, and FIG. 1B is a partial enlarged view of a section A illustrated in FIG. 1A. As illustrated in FIG. 1A and FIG. 1B, a substrate fixing device 1 includes a base plate 10, an adhesive layer 20, and an electrostatic chuck 30, among other things.

The base plate 10 may be formed by a member that is configured to receive the electrostatic chuck 30 mounted thereon. The base plate 10 may have a thickness of approximately 20 mm to approximately 40 mm, for example. The base plate 10 is made of aluminum (Al), for example, and may be utilized as an electrode or the like for controlling the plasma. By supplying a predetermined high-frequency power to the base plate 10, it is possible to control an energy for causing collision of generated ions or the like in the plasma state onto a wafer (not illustrated) attracted to the electrostatic chuck 30, to efficiently perform an etching process.

A gas supply section 11 is provided inside the base plate 10, the gas supply section 11 includes a gas passage 111, a gas injecting portion 112, and gas exhaust portions 113.

The gas passage 111 may be formed by a round-shaped hole (or annular opening) that is formed inside the base plate 10, for example. The gas injection portion 112 may be formed by a hole having one end thereof in communication with the gas passage 111, and the other end thereof exposed to the outside via a lower surface 10b of the base plate 10, for example. The gas injection portion 112 introduces an inert gas (for example, helium (He), argon (Ar), or the like) to the gas passage 111 from the outside of the substrate fixing device 1. The gas exhaust portions 113 may be formed by holes respectively having one end thereof in communication with the gas passage 111, and the other end thereof exposed to the outside via an upper surface 10a of the base plate 10, for example. The gas exhaust portions 113 exhaust the inert gas that is introduced into the gas passage 111. In a plan view, the holes forming the gas exhaust portions 113 are locally provided in the upper surface 10a. The number of holes forming the gas exhaust portions 113 is not particularly limited, and may be suitably determined, as appropriate. For example, the number of holes forming the gas exhaust portions 113 may be approximately several tens to approximately several hundreds of holes.

The plan view of an element refers to a view from above in a direction normal to the upper surface 10a of the base plate 10. A planar shape of an element refers to a shape of the element in the plan view of the element from above in the direction normal to the upper surface 10a of the base plate 10.

A cooling mechanism 15 is provided inside the base plate 10. The cooling mechanism 15 includes a coolant passage 151, a coolant supplying portion 152, and a coolant ejecting portion 153. The coolant passage 151 may be formed by a ring-shaped hole (or annular opening) inside the base plate 10, for example. The coolant supplying portion 152 may be formed by a hole having one end thereof in communication with the coolant passage 151, and the other end thereof exposed to the outside from the lower surface 10b of the base plate 10, for example. The coolant supplying portion 152 supplies a coolant (for example, cooling water, galden, or the like) to the coolant passage 151 from the outside of the substrate fixing device 1. The coolant ejecting portion 153 may be formed by a hole having one end thereof in communication with the coolant passage 151, and the other end thereof exposed to the outside via the lower surface 10b of the base plate 10, for example. The coolant ejecting portion 153 ejects the coolant that is supplied to the coolant passage 151.

The cooling mechanism 15 is connected to a coolant control device (not illustrated) that is provided externally to the substrate fixing device 1. The coolant control device (not illustrated) supplies the coolant from the coolant supplying portion 152 to the coolant passage 151, and ejects the coolant from the coolant ejecting portion 153. The wafer (not illustrated) attracted onto the electrostatic chuck 30 can be cooled by circulating the coolant to the cooling mechanism 15 to cool the base plate 10.

The electrostatic chuck 30 is a section that holds the wafer (not illustrated), which is an example of a target to be held by electrostatic attraction. The electrostatic chuck 30 may have a planar shape that is a circular shape, for example. A diameter of the wafer (not illustrated), which is the example of the target to be held by the electrostatic chuck 30, may be 8 inches, 12 inches, or 18 inches, for example.

The electrostatic chuck 30 is provided on the upper surface 10a of the base plate 10 via the adhesive layer 20. The adhesive layer 20 may be formed by a silicone adhesive, for example. The adhesive layer 20 may have a thickness of approximately 0.1 mm to approximately 1.0 mm, for example. The adhesive layer 20 adheres the base plate 10 and the electrostatic chuck 30 together, and also has the effect of reducing stress generated due to a difference between the coefficient of thermal expansion of the electrostatic chuck 30 made of ceramics, and the coefficient of thermal expansion of the base plate 10 made of aluminum.

The electrostatic chuck 30 includes a base 31, and an electrostatic electrode 32. An upper surface of the base 31 forms a mounting surface 31a on which the target to be held by electrostatic attraction is mounted. In this example, the electrostatic chuck 30 may be formed by a Johnsen-Rahbeck type electrostatic chuck that utilizes the Johnsen-Rahbeck effect. However, the electrostatic chuck 30 may be formed by a Coulomb type electrostatic chuck that utilizes the Coulomb force.

The base 31 is made of a dielectric material. For example, ceramics such as aluminum oxide ($Al_2O_3$), aluminum nitride (AlN), or the like may be used for the dielectric material forming the base 31. The base 31 may have a thickness of approximately 1 mm to approximately 5 mm, for example. The relative permittivity of the base 31 under room temperature at 1 kHz may be approximately 9 to approximately 10.

The electrostatic electrode 32 may be a thin film electrode, and is provided inside the base 31. The electrostatic electrode 32 is electrically connected to a power supply (not illustrated) that is provided externally to the substrate fixing device 1. When a predetermined voltage is applied to the electrostatic electrode 32 from the power supply (not illustrated), an electrostatic attraction force is generated between the electrostatic electrode 32 and the wafer (not illustrated). Accordingly, the wafer (not illustrated) can be held on the mounting surface 31a of the base 31 of the electrostatic chuck 30 by electrostatic attraction. The electrostatic attraction force becomes stronger as the voltage applied to the electrostatic electrode 32 becomes higher. The electrostatic electrode 32 may have a monopolar shape or a bipolar shape. The electrostatic electrode 32 may be made of a material such as tungsten (W), molybdenum (Mo), or the like, for example.

A heating element, that generates heat when applied with a voltage from the outside of the substrate fixing device 1, may be provided inside the base 31, to heat the mounting surface 31a of the base 31 to a predetermined temperature.

An insertion hole 311, that penetrates the base 31 and exposes the other end of the gas exhaust portion 113, is provided at positions corresponding to each of the gas exhaust portions 113 of the base 31. The insertion holes 311 may have a planar shape that is a circular shape having an internal diameter of approximately 2 mm to approximately 5 mm, for example. The insertion holes 311 may be formed by drilling or laser machining, for example. An inner surface defining the insertion hole 311 may be threaded to form a female thread, and a screw member 60 may be detachably screwed into the insertion hole 311.

Figure 2A:
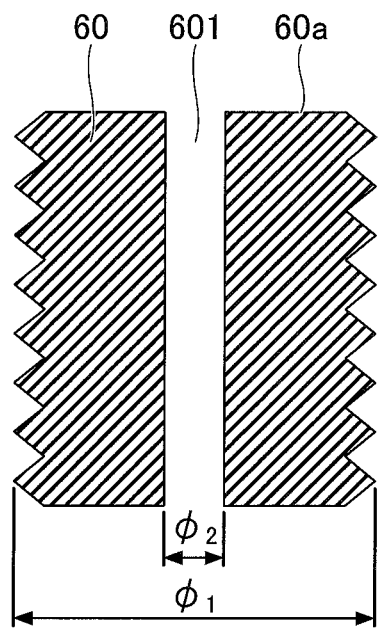
FIG. 2A, FIG. 2B, FIG. 2C, and FIG. 2D are diagrams illustrating examples of shapes of a screw member.

FIG. 2A, FIG. 2B, FIG. 2C, and FIG. 2D are diagrams illustrating examples of shapes of the screw member. As illustrated in FIG. 2A, the screw member 60 may be formed by a cylindrical member that is made of ceramics such as aluminum oxide (Al$_2$O$_3$), aluminum nitride (AlN), or the like, for example. A side surface (or outer wall) of screw member 60 may be threaded to form a male thread. When using the substrate fixing device 1, the screw member 60 is screwed into the insertion hole 311 and assumes a mated state, the male thread of the screw member 60 mates with the female thread of the insertion hole 311. During maintenance of the substrate fixing device 1, the screw member 60 may be loosened and removed from the insertion hole 311. The mated state of a first member and a second member refers to a connected state in which a male thread formed on the first member mates with a female thread formed on the second member.

The screw member 60 includes a through-hole 601 having one end thereof opening at the mounting surface 31a of the base 31, and the other end thereof in communication with the gas exhaust portion 113 of the gas supply section 11. The through-hole 601 may have a planar shape that is a circular shape, for example. A diameter $\phi_1$ of the screw member 60 may be approximately 2 mm to approximately 5 mm, for example. A diameter $\phi_2$ of the through-hole 601 is preferably approximately 0.1 mm to approximately 0.05 mm, for example.

Because the through-hole 601 in the screw member 60 that is screwed into the insertion hole 311 communicates to the gas exhaust portion 113 of the gas supply section 11, a gas is supplied from the gas supply section 11 to the mounting surface 31a of the base 31 via the through-hole 601. An upper surface 60a of the screw member 60 coincides with the mounting surface 31a of the base 31, for example.

Figure 2C:
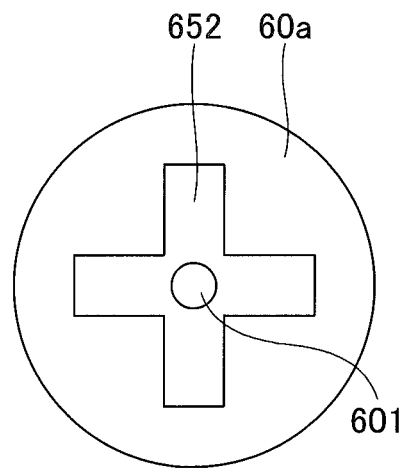
Figure 2B:
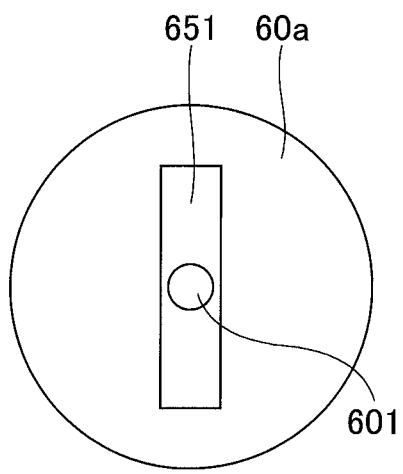

For example, as illustrated in FIG. 2B, a flat-head slot 651 may be provided in the upper surface 60a of the screw member 60. In this case, by inserting a flat-head screw driver into the slot 651 and turning the flat-head screw driver, the screw member 60 can be screwed into or loosened and removed from the insertion hole 311.

For example, as illustrated in FIG. 2C, a cross-head slot 652 may be provided in the upper surface 60a of the screw member 60. In this case, by inserting a cross-head screw driver into the slot 652 and turning the cross-head screw driver, the screw member 60 can be screwed into or loosened and removed from the insertion hole 311.

Figure 2D:
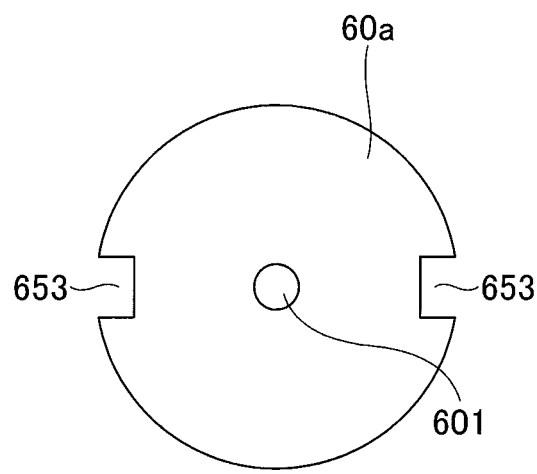

For example, as illustrated in FIG. 2D, a pair of grooves (or bi-groove) 653 may be provided in an outer periphery of the upper surface 60a of the screw member 60. The grooves 653 are provided at diametrically opposite positions opposing each other via the through-hole 601. In this case, by inserting projections of a jig exclusively for engaging the grooves 653 and turning the jig, the screw member 60 can be screwed into or loosened and removed from the insertion hole 311.

The structure that enables the screw member 60 to be turned is not limited to the structures illustrated in FIG. 2B through FIG. 2D, as long as a structure that enables the screw member 60 to be turned is provided at a portion of the screw member 60 exposed at the mounting surface 31a. In other words, the portion of the screw member 60 exposed at the mounting surface 31a may be provided with an arbitrary structure that enables the screw member 60 to be turned.

When manufacturing the screw member 60, a paste, that serves as a precursor of the screw member 60, is first prepared. The paste may include a predetermined weight ratio of aluminum oxide (Al$_2$O$_3$) particles and aluminum nitride (AlN) particles, for example.

Next, a wire member having a diameter of 0.1 mm or less is prepared. Then, the paste is inserted into a cylindrical mold for molding the screw member 60, and molded. When molding the paste, the wire member is inserted into a central portion of the paste along a longitudinal direction of the paste. Thereafter, the molded paste is fired, and the wire member is extracted from the fired molded paste. As a result, a tubular member having a through-hole in a central portion along a longitudinal direction thereof, where the through-hole has a diameter of 0.1 mm or less, is formed. This tubular member is cut to a predetermined length, and a side surface (or outer wall) of the cut tubular member is threaded to form a male thread, to thereby complete the screw member 60.

According to results of research conducted by the present inventors, it was found that an abnormal discharge may be generated in the gas supply section 11 when the diameter of the hole opening at the mounting surface 31a of the base 31 is large. In contrast, it was found that the abnormal discharge generated in the gas supply section 11 may be reduced by setting the diameter of the hole opening at the mounting surface 31a of the base 31 to 0.1 mm or less.

In the substrate fixing device 1, the screw member 60 having the through-hole 601 that has the diameter of 0.1 mm or less, is screwed into the insertion hole 311 that is formed in the base 31, and assumes the mated state. In other words, because the diameter of the portion of the through-hole 601 opening at the mounting surface 31a of the base 31 is 0.1 mm or less, it is possible to reduce the abnormal discharge generated in the gas supply section 11. If appropriate, a plurality of through-holes 601 having the diameter of 0.1 mm or less may be provided in a single screw member 60.

In addition, the screw member 60 is fixed inside the insertion hole 311 in a detachable state. For this reason, when a problem occurs in the screw member 60, such as when the through-hole 601 is blocked by a foreign particle or the like, for example, it is possible to remove the screw member 60 and easily replace the removed screw member 60 with a new screw member 60. According to the conventional structure, when a problem occurs in one gas exhaust portion 113, the entire electrostatic chuck 30 becomes a defective component, thereby generating a loss and incurring significant cost. In contrast, according to the substrate fixing device 1, each screw member 60 is easily replaceable, and it is possible to reduce the loss and incurring cost, and to extend the serviceable life of the substrate fixing device 1 in comparison to the conventional structure.

With the substrate fixing device 1, it is theoretically possible to form, the through-hole 601 having the diameter of 0.1 mm or less, directly in the base 31, without using the screw member 60. However, in actual practice, it is extremely difficult to form a large number of through-holes 601 having the diameter of 0.1 mm or less in the base 31, as doing so would deteriorate the yield and to increase the cost of the substrate fixing device 1. In addition, when the substrate fixing device 1 is used in a dry etching apparatus or the like and the through-hole 601 is blocked by the byproducts of the like of the etching, it is extremely difficult to remove the byproducts or the like blocking the through-hole 601. In other words, forming the through-hole 601 having the diameter of 0.1 mm or less, directly in the base 31, is not a practical countermeasure against the abnormal discharge generated in the gas supply section 11. In contrast, the above described problems can be solved by fixing the screw member 60, including the through-hole 601 having the diameter of 0.1 mm or less, inside the insertion hole 311 in the detachable state. Further, it is possible to provide the substrate fixing device 1 in which the countermeasure against the abnormal discharge enables easy maintenance.

Second Embodiment

In an example of the substrate fixing device according to a second embodiment, the screw member differs from that of the first embodiment. In the second embodiment, those constituent parts that are the same as those of the first embodiment may be omitted.

Figure 3A:
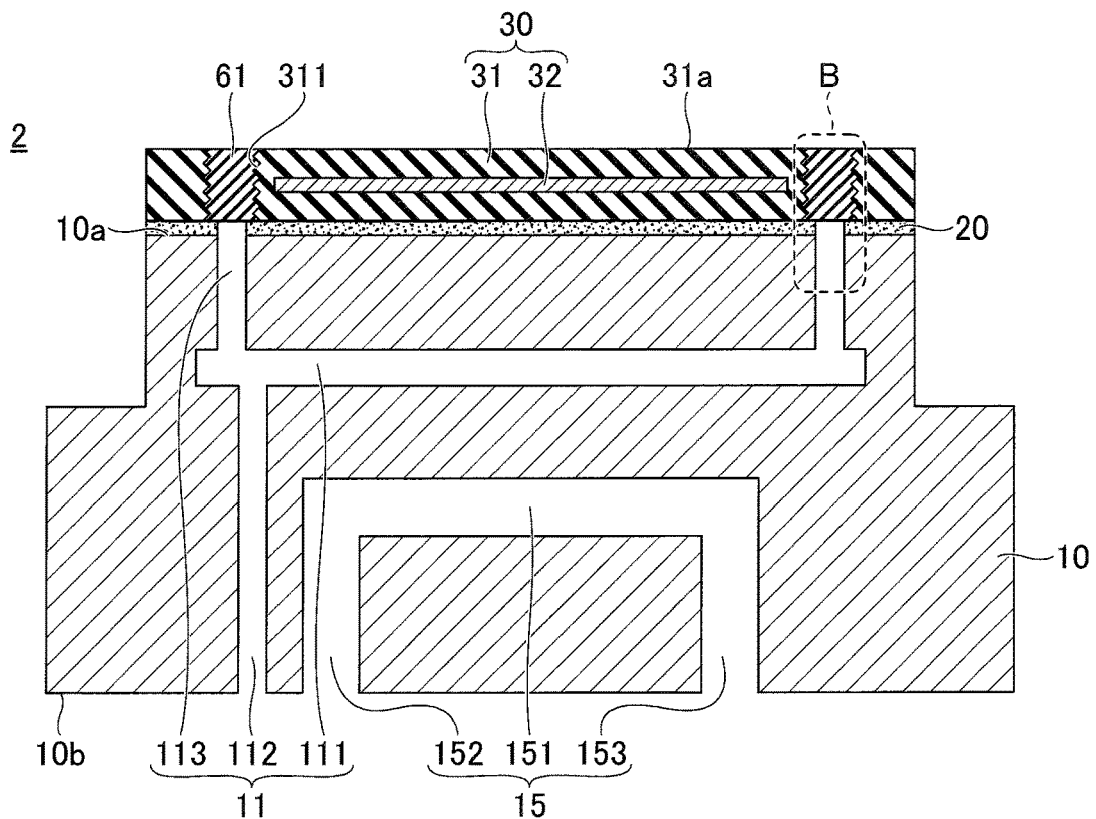
FIG. 3A and FIG. 3B are cross sectional views schematically illustrating an example of the substrate fixing device according to a second embodiment.
Figure 3B:
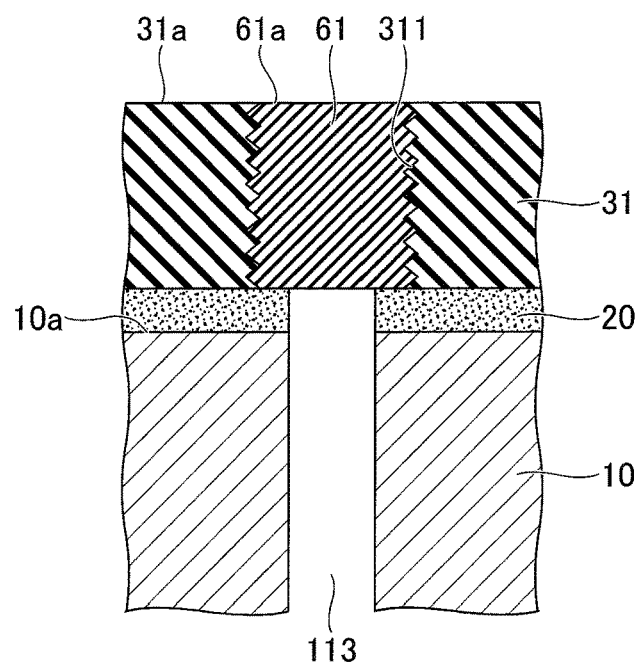

FIG. 3A and FIG. 3B are cross sectional views schematically illustrating the example of the substrate fixing device according to the second embodiment. FIG. 3A illustrates the entire substrate fixing device, and FIG. 3B is a partial enlarged view of a section B illustrated in FIG. 3A. As illustrated in FIG. 3A and FIG. 3B, a substrate fixing device 2 differs from the substrate fixing device 1 illustrated in FIG. 1A and FIG. 1B, in that a screw member 61 is used in place of the screw member 60.

A side surface (or outer wall) of the screw member 61 is threaded, and the screw member 61 is screwed into the insertion hole 311 defined by the threaded inner surface, to assume a mated state in which the thread of the screw member 61 mates with the thread of the insertion hole 311. In this state, an upper surface 61a of the screw member 61 coincides with the mounting surface 31a of the base 31, for example.

One of the structures illustrated in FIG. 2B through FIG. 2D, or the arbitrary structure that enables the screw member 61 to be turned, is provided in the upper surface 61a of the screw member 61. For this reason, the screw member 61 may be screwed into or loosened and removed from the insertion hole 311, as appropriate.

Unlike the screw member 60, the screw member 61 may be formed by a porous body including ceramics, such as aluminum oxide ($Al_2O_3$), aluminum nitride (AlN), or the like, as a main component thereof. The screw member 61 may be made of a material including the ceramics, such as aluminum oxide ($Al_2O_3$), aluminum nitride (AlN), or the like, in a range of 80 weight percent (%) to 97 weight %, for example. Because the porous body forming the screw member 61 allows gas to pass through, the screw member 61 is not formed with a through-hole corresponding to the through-hole 601 of the screw member 60.

Figure 4:
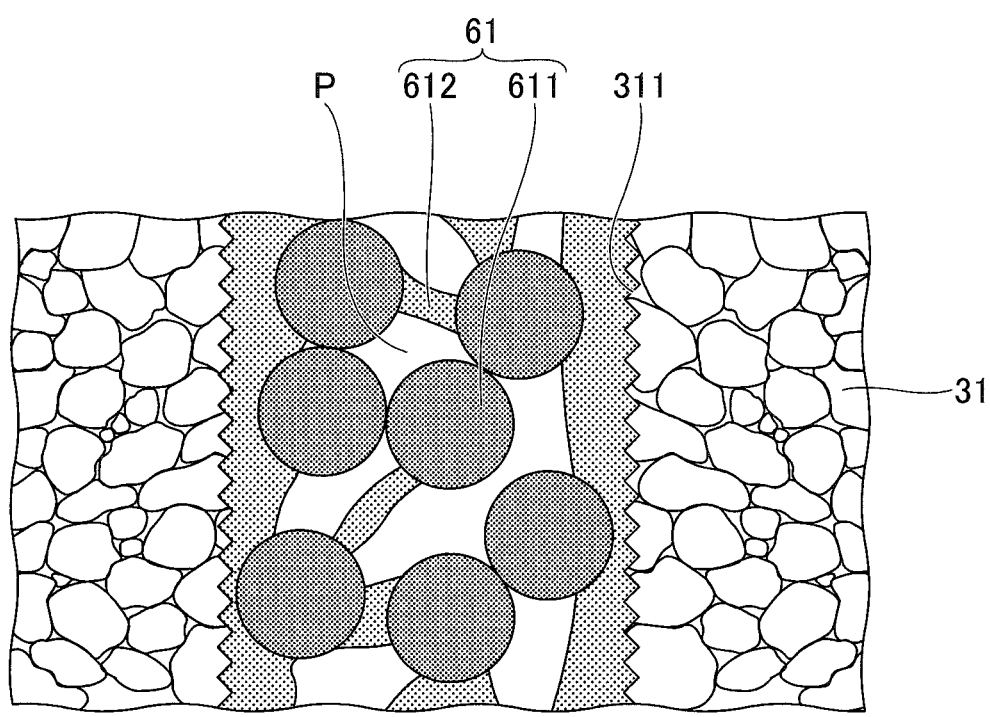
FIG. 4 is an enlarged cross sectional view of a vicinity of the screw member illustrated in FIG. 3B.

FIG. 4 is an enlarged cross sectional view of a vicinity of the screw member illustrated in FIG. 3B. As illustrated in FIG. 4, the screw member 61, formed by the porous body, includes a plurality of spherical oxide ceramics particles 611, and a mixed oxide 612 integrally binding the plurality of spherical oxide ceramics particles 611.

The spherical oxide ceramics particles 611 may have a diameter in a range of 30 μm to 1000 μm, for example. In a preferable example, the spherical oxide ceramics particles 611 are spherical alumina particles. In addition, a weight ratio of the spherical oxide ceramics particles 611 included in the screw member 61 is preferably in a range of 80 weight % or higher and 97 weight % or lower.

The mixed oxide 612 supports the plurality of spherical oxide ceramics particles 611 by binding to portions of outer surfaces (or spherical surfaces) of the plurality of spherical oxide ceramics particles 611. The mixed oxide 612 may be formed by two or more oxides selected from a group consisting of silicon (Si), magnesium (Mg), calcium (Ca), aluminum (Al), and yttrium (Y), for example.

Pores P are formed inside the screw member 61. The pores P communicate to the outside, so that the gas can pass through the screw member 61 from a lower end toward an upper end of the screw member 61. The porosity of the pores P formed inside the screw member 61 is preferably in a range of 20% to 50% of the total volume of the screw member 61. The portions of the outer surfaces of the spherical oxide ceramics particles 611 and the mixed oxide 612 are exposed at inner surfaces of the pores P.

When manufacturing the screw member 61, a paste, that becomes a precursor of the screw member 61, is first prepared. The paste may include a predetermined weight ratio of spherical oxide aluminum particles. The remainder of the paste may include an oxide including five components that are silicon (Si), magnesium (Mg), calcium (Ca), aluminum (Al), and yttrium (Y). The remainder of the paste may further include an organic binder, a solvent, or the like. An example of the organic binder usable in the remainder of the paste includes polyvinyl butyral, for example. An example of the solvent usable in the remainder of the paste includes alcohol, for example.

Next, the paste is inserted into a cylindrical mold for molding the screw member 61, and molded. Thereafter, the molded paste is fired at a predetermined temperature, cut to a predetermined length, and a side surface (or outer wall) of the cut member is threaded to form a male thread, to thereby complete the screw member 61.

As described above, the abnormal discharge may be generated in the gas supply section 11 when the diameter of the hole opening at the mounting surface 31a of the base 31 is large.

In the substrate fixing device 2, the screw member 61, formed by the porous body, is screwed into the insertion hole 311, to assume the mated state. No through-hole is formed in the screw member 61, but the gas from the gas supply section 11 is supplied to the mounting surface 31a of the base 31 via the plurality of mutually communicating pores P of the screw member 61. Hence, with the substrate fixing device 2, it is possible to reduce the abnormal discharge generated in the gas supply section 11, because the screw member 61 does not include a through-hole that opens at the mounting surface 31a of the base 31.

In addition, the screw member 61 is fixed inside the insertion hole 311 in a detachable state. For this reason, when a problem occurs in the screw member 61, such as when a portion of the pores P is blocked by a foreign particle or the like, for example, it is possible to remove the screw member 61 and easily replace the removed screw member 61 with a new screw member 61. According to the conventional structure, when a problem occurs in one gas exhaust portion 113, the entire electrostatic chuck 30 becomes a defective component, thereby generating a loss and incurring significant cost. In contrast, according to the substrate fixing device 2, each screw member 61 is easily replaceable, and it is possible to reduce the loss and incurring cost, and to extend the serviceable life of the substrate fixing device 2 in comparison to the conventional structure.

Third Embodiment

In an example of the substrate fixing device according to a third embodiment, the screw member differs from those of the first and second embodiments. In the third embodiment, those constituent parts that are the same as those of the embodiments described above may be omitted.

Figure 5A:
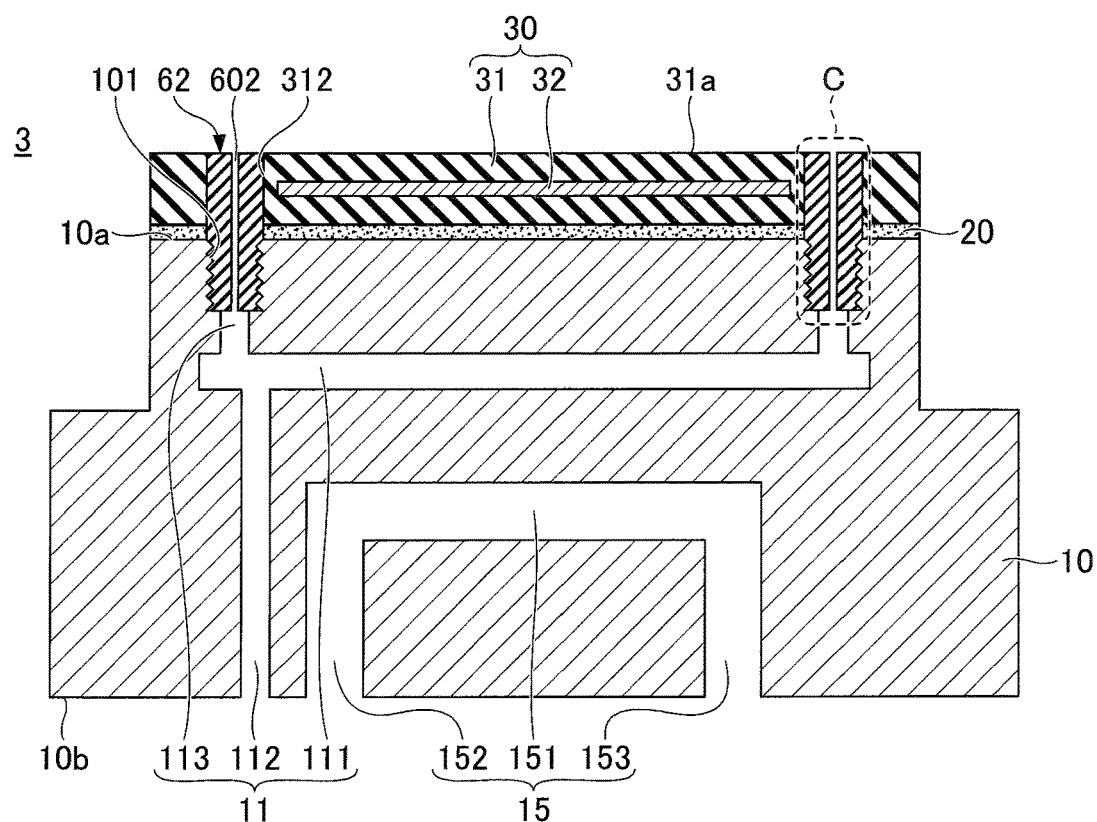
FIG. 5A and FIG. 5B are cross sectional views schematically illustrating an example of the substrate fixing device according to a third embodiment.
Figure 5B:
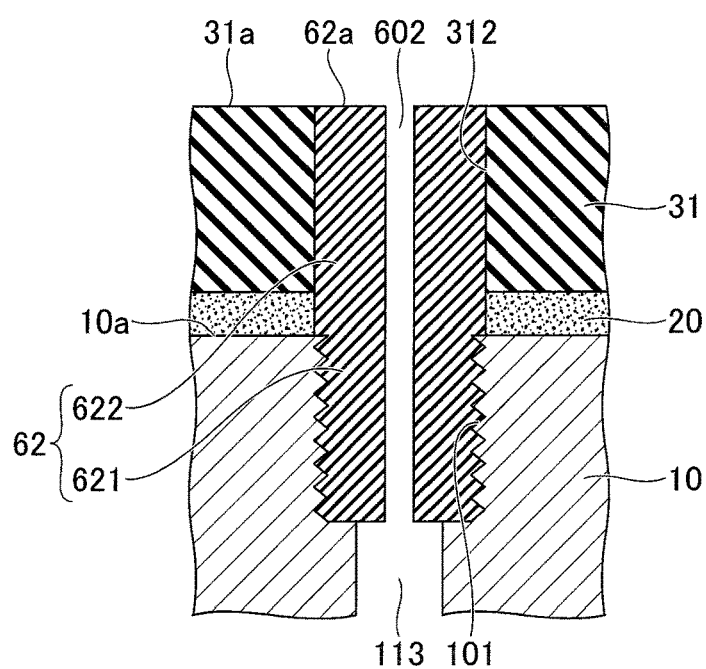

FIG. 5A and FIG. 5B are cross sectional views schematically illustrating the example of the substrate fixing device according to the third embodiment. FIG. 5A illustrates the entire substrate fixing device, and FIG. 5B is a partial enlarged view of a section C illustrated in FIG. 5A. As illustrated in FIG. 5A and FIG. 5B, a substrate fixing device 3 differs from the substrate fixing device 1 illustrated in FIG. 1A and FIG. 1B, in that a screw member 62 is used in place of the screw member 60.

An insertion hole 312, that penetrates the base 31 and the adhesive layer 20 to expose the other end of the gas exhaust portion 113, is provided in the base 31 at a position corresponding to each gas exhaust portion 113. The insertion hole 312 may have a planar shape that is a circular shape having an internal diameter of approximately 2 mm to approximately 5 mm, for example. The insertion holes 312 may be formed by drilling or laser machining, for example. No female thread is formed on an inner surface defining the insertion hole 312.

A recess (or counterbore hole) 101, that has an open end in communication with the insertion hole 312 and a bottom surface exposing the other end of the gas exhaust portion 113, is provided in the upper surface 10a of the base plate 10 at a position corresponding to each gas exhaust portion 113. The recess 101 may have a planar shape that is a circular shape having an inner diameter of approximately 2 mm to approximately 5 mm, for example. The recess 101 may be formed by drilling or laser machining, for example. An inner surface defining the recess 101 may be threaded to form a female thread.

The screw member 62 may be formed by a member that is made of ceramics such as aluminum oxide ($Al_2O_3$), aluminum nitride (AlN), or the like, for example. The screw member 62 includes a screw portion 621, and a cylindrical portion 622 that is continuously formed on an end of the screw portion 621 along a longitudinal direction thereof. In the screw member 62, a side surface (or outer surface) of the screw portion 621 is threaded, but a side surface (or outer surface) of the cylindrical portion 622 is not threaded. In other words, in the screw member 62, the side surface on the side of the base plate 10 is threaded, but the side surface on the side of the electrostatic chuck 30 is not threaded. When using the substrate fixing device 3, the screw member 62 is screwed into the insertion hole 312 and the recess 101 that communicate with each other, to assume a mated state in which the thread of screw portion 621 of the screw member 62 mates with the thread of the recess 101. During maintenance of the substrate fixing device 3, the screw member 62 may be loosened and removed from the insertion hole 312 and the recess 101.

The male thread formed on the side surface of the screw portion 621 of the screw member 62 mates with the female thread formed on the inner surface defining the recess 101. However, the cylindrical portion 622 of the screw member 62 is simply inserted into the insertion hole 312 and is not fixed therein. The side surface of the cylindrical portion 622 and the inner surface defining the insertion hole 312 may make contact with each other, or a slight clearance may be provided therebetween.

The screw member 62 includes a through-hole 602 having one end thereof opening at the mounting surface 31a of the base 31, and the other end thereof in communication with the gas exhaust portion 113 of the gas supply section 11. The through-hole 602 may have a planar shape that is a circular shape, for example. The diameter of the screw member 62 may be approximately 2 mm to approximately 5 mm, for example. The diameter of the through-hole 602 is preferably approximately 0.1 mm to approximately 0.05 mm, for example.

Because the through-hole 602 in the screw member 62 that is screwed into the insertion hole 312 communicates to the gas exhaust portion 113 of the gas supply section 11, a gas is supplied from the gas supply section 11 to the mounting surface 31a of the base 31 via the through-hole 602. An upper surface 62a of the screw member 62 coincides with the mounting surface 31a of the base 31, for example.

One of the structures illustrated in FIG. 2B through FIG. 2D, or the arbitrary structure that enables the screw member 62 to be turned, may be provided in the upper surface 62a of the screw member 62. For this reason, the screw member 62 may be screwed into or loosened and removed from the insertion hole 312 and the recess 101 that communicate with each other, as appropriate. A method of manufacturing the screw member 62 may be similar to the method of manufacturing the screw member 60.

As described above, the abnormal discharge may be generated in the gas supply section 11 when the diameter of the hole opening at the mounting surface 31a of the base 31 is large.

In the substrate fixing device 3, the screw member 62, including the through-hole 602 having the diameter of 0.1 mm or less, is screwed into the insertion hole 312 and the recess 101 to assume the mated state. In other words, because the diameter of the portion of the through-hole 602 opening at the mounting surface 31a of the base 31 is 0.1 mm or less, it is possible to reduce the abnormal discharge generated in the gas supply section 11. If appropriate, a plurality of through-holes 602 having the diameter of 0.1 mm or less may be provided in a single screw member 62.

In addition, the screw member 62 is fixed inside the insertion hole 312 and the recess 101 in a detachable state. For this reason, when a problem occurs in the screw member 62, such as when the through-hole 602 is blocked by a foreign particle or the like, for example, it is possible to remove the screw member 62 and easily replace the removed screw member 62 with a new screw member 62. According to the conventional structure, when a problem occurs in one gas exhaust portion 113, the entire electrostatic chuck 30 becomes a defective component, thereby generating a loss and incurring significant cost. In contrast, according to the substrate fixing device 3, each screw member 62 is easily replaceable, and it is possible to reduce the loss and incurring cost, and to extend the serviceable life of the substrate fixing device 3 in comparison to the conventional structure.

Fourth Embodiment

In an example of the substrate fixing device according to a fourth embodiment, the screw member differs from those of the first through third embodiments. In the fourth embodiment, those constituent parts that are the same as those of the embodiments described above may be omitted.

Figure 6A:
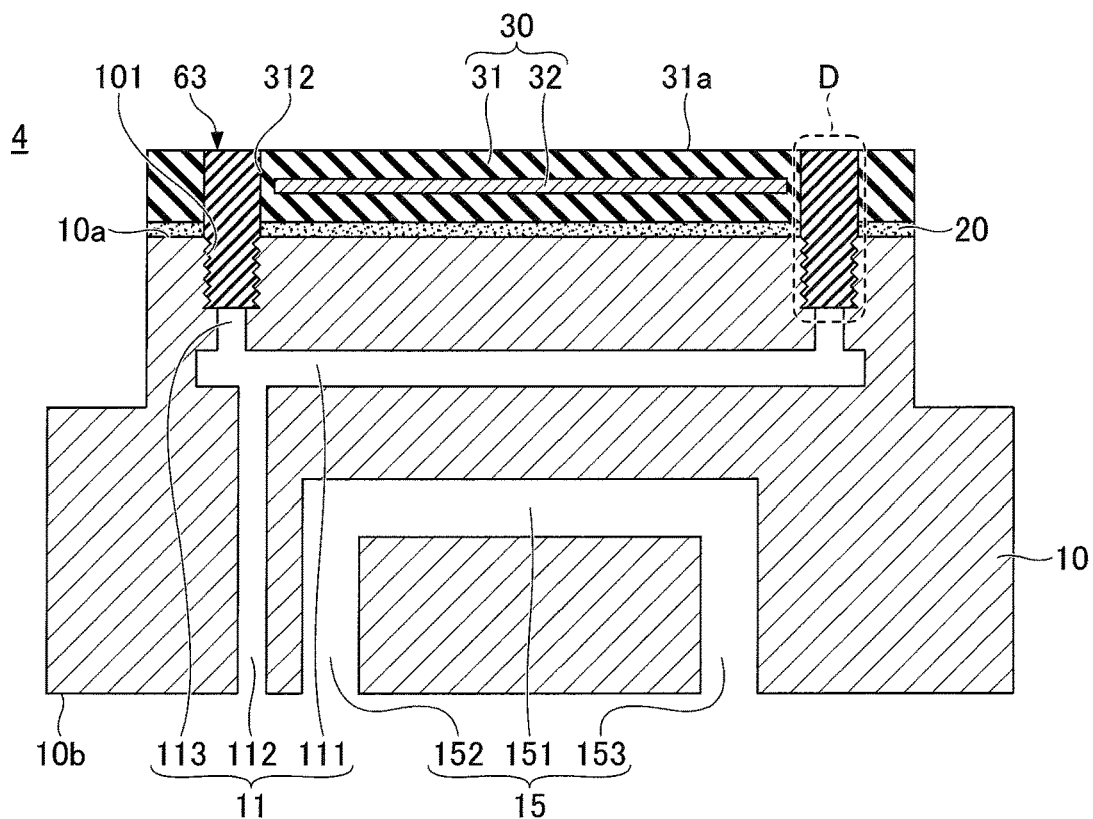
FIG. 6A and FIG. 6B are cross sectional views schematically illustrating an example of the substrate fixing device according to a fourth embodiment.
Figure 6B:
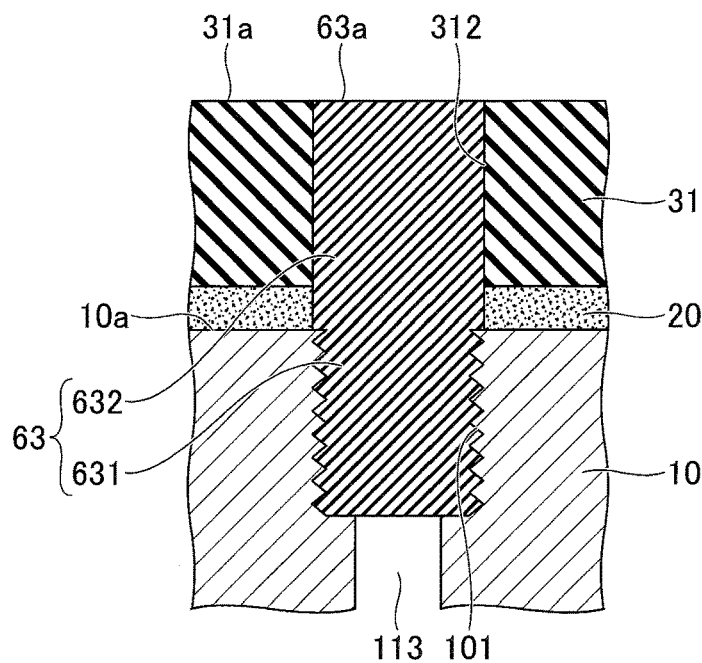

FIG. 6A and FIG. 6B are cross sectional views schematically illustrating the example of the substrate fixing device according to the fourth embodiment. FIG. 6A illustrates the entire substrate fixing device, and FIG. 6B is a partial enlarged view of a section D illustrated in FIG. 6A. As illustrated in FIG. 6A and FIG. 6B, a substrate fixing device 4 differs from the substrate fixing device 3 illustrated in FIG. 5A and FIG. 5B, in that a screw member 63 is used in place of the screw member 62.

The screw member 63 includes a screw portion 631, and a cylindrical portion 632 that is continuously formed on an end of the screw portion 631 along a longitudinal direction thereof. In the screw member 63, a side surface (or outer surface) of the screw portion 631 is threaded, but a side surface (or outer surface) of the cylindrical portion 632 is not threaded. In other words, in the screw member 63, the side surface on the side of the base plate 10 is threaded, but the side surface on the side of the electrostatic chuck 30 is not threaded. When using the substrate fixing device 4, the screw member 63 is screwed into the insertion hole 312 and the recess 101 that communicate with each other, to assume a mated state in which the thread of screw portion 631 of the screw member 63 mates with the thread of the recess 101. During maintenance of the substrate fixing device 4, the screw member 63 may be loosened and removed from the insertion hole 312 and the recess 101.

The male thread formed on the side surface of the screw portion 631 of the screw member 63 mates with the female thread formed on the inner surface defining the recess 101. However, the cylindrical portion 632 of the screw member 63 is simply inserted into the insertion hole 312 and is not fixed therein. The side surface of the cylindrical portion 632 and the inner surface defining the insertion hole 312 may make contact with each other, or a slight clearance may be provided therebetween. An upper surface 63a of the screw member 63 coincides with the mounting surface 31a of the base 31, for example.

One of the structures illustrated in FIG. 2B through FIG. 2D, or the arbitrary structure that enables the screw member 63 to be turned, is provided in the upper surface 63a of the screw member 63. For this reason, the screw member 63 may be screwed into or loosened and removed from the insertion hole 311 and the recess 101 that communicate with each other, as appropriate.

The screw member 63 may be formed by the porous body illustrated in FIG. 4 including ceramics, such as aluminum oxide ($Al_2O_3$), aluminum nitride (AlN), or the like, as the main component thereof. Because the porous body forming the screw member 63 allows gas to pass through, the screw member 63 is not formed with a through-hole corresponding to the through-hole 602 of the screw member 62. A method of manufacturing the screw member 63 may be similar to the method of manufacturing the screw member 61.

As described above, the abnormal discharge may be generated in the gas supply section 11 when the diameter of the hole opening at the mounting surface 31a of the base 31 is large.

In the substrate fixing device 4, the screw member 63, formed by the porous body, is screwed into the insertion hole 312 and the recess 101, to assume the mated state. No through-hole is formed in the screw member 63, but the gas from the gas supply section 11 is supplied to the mounting surface 31a of the base 31 via the plurality of mutually communicating pores P of the screw member 63. Hence, with the substrate fixing device 4, it is possible to reduce the abnormal discharge generated in the gas supply section 11, because the screw member 63 does not include a through-hole that opens at the mounting surface 31a of the base 31.

In addition, the screw member 63 is fixed inside the insertion hole 312 and the recess 101 that communicate with each other, in a detachable state. For this reason, when a problem occurs in the screw member 63, such as when a portion of the pores P is blocked by a foreign particle or the like, for example, it is possible to remove the screw member 63 and easily replace the removed screw member 63 with a new screw member 63. According to the conventional structure, when a problem is generated in one gas exhaust portion 113, the entire electrostatic chuck 30 becomes a defective component, thereby generating a loss and incurring significant cost. In contrast, according to the substrate fixing device 4, each screw member 63 is easily replaceable, and it is possible to reduce the loss and incurring cost, and to extend the serviceable life of the substrate fixing device 4 in comparison to the conventional structure.

Fifth Embodiment

In an example of the substrate fixing device according to a fifth embodiment, an insertion member is provided separately from the screw member. In the fifth embodiment, those constituent parts that are the same as those of the embodiments described above may be omitted.

Figure 7A:
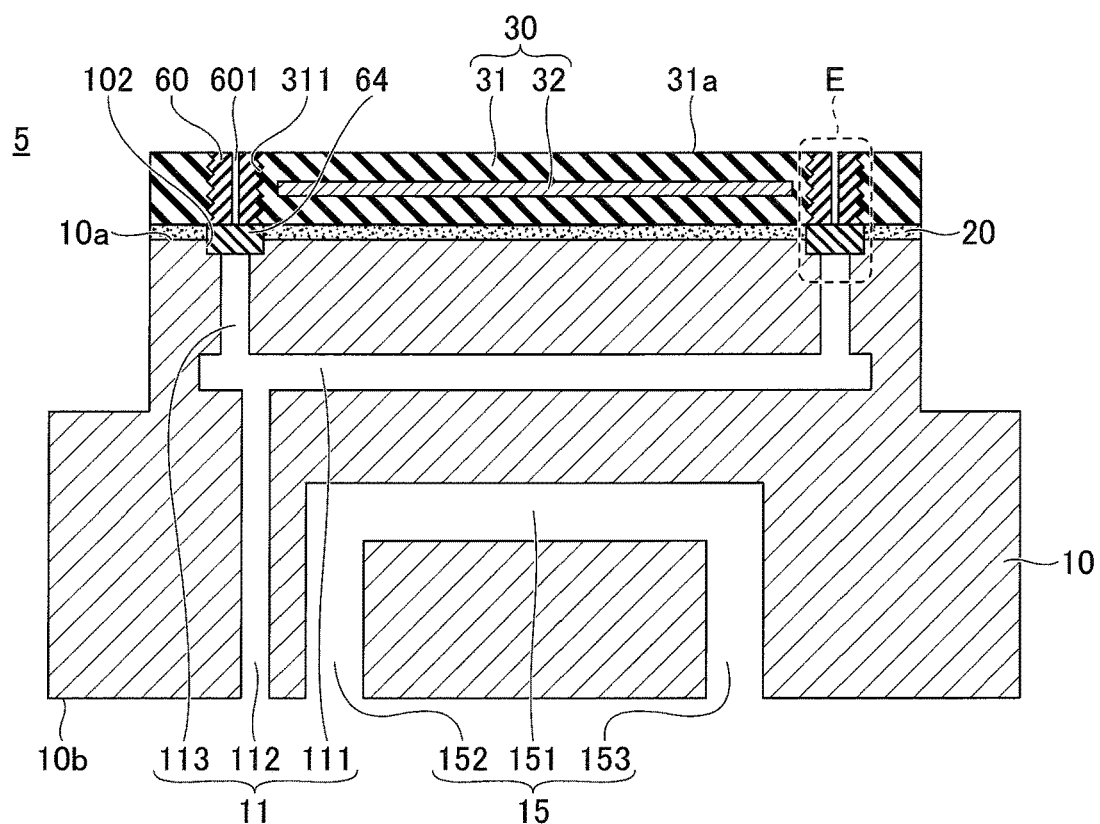
FIG. 7A and FIG. 7B are cross sectional views schematically illustrating an example of the substrate fixing device according to a fifth embodiment.
Figure 7B:
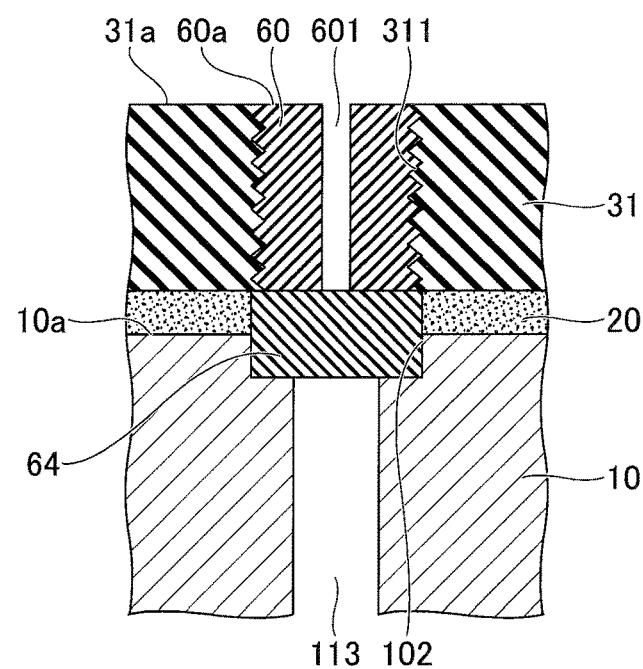

FIG. 7A and FIG. 7B are cross sectional views schematically illustrating the example of the substrate fixing device according to the fifth embodiment. FIG. 7A illustrates the entire substrate fixing device, and FIG. 7B is a partial enlarged view of a section E illustrated in FIG. 7A. As illustrated in FIG. 7A and FIG. 7B, a substrate fixing device 5 differs from the substrate fixing device 1 illustrated in FIG. 1A and FIG. 1B, in that an insertion member 64 is additionally provided in a recess 102.

The recess 102, that has an open end in communication with the insertion hole 311 and a bottom surface exposing the other end of the gas exhaust portion 113, is provided in the upper surface 10a of the base plate 10 at a position corresponding to each gas exhaust portion 113. The recess 102 may have a planar shape that is a circular shape having an inner diameter of approximately 2 mm to approximately 5 mm, for example. The recess 102 may be formed by drilling or laser machining, for example. An inner surface defining the recess 102 is not threaded.

The insertion member 64 is inserted into the recess 102, but is not fixed in the recess 102. A side surface of the insertion member 64 and the inner surface defining the recess 102 may make contact with each other, or a slight clearance may be provided therebetween.

The insertion member 64 may be formed by the porous body illustrated in FIG. 4 including ceramics, such as aluminum oxide ($Al_2O_3$), aluminum nitride (AlN), or the like, as the main component thereof. Because the porous body forming the insertion member 64 allows gas to pass through, the insertion member 64 is not formed with a through-hole that communicates with the through-hole 601 of the screw member 60. A method of manufacturing the insertion member 64 may be similar to the method of manufacturing the screw member 61.

After inserting the insertion member 64 into the recess 102, the screw member 60 is screwed into the insertion hole 311 to assume the mated state. For this reason, the insertion member 64 will not fall out of the recess 102.

As described above, the abnormal discharge may be generated in the gas supply section 11 when the diameter of the hole opening at the mounting surface 31a of the base 31 is large.

In the substrate fixing device 5, the screw member 60, including the through-hole 601 having the diameter of 0.1 mm or less, is screwed into the insertion hole 311 and fixed therein. Further, the insertion member 64, formed by the porous body, is inserted to make contact with the screw member 60, on the side of the screw member 60 at the lower surface 10b of the base plate 10. The gas from the gas supply section 11 is supplied to the mounting surface 31a of the base 31 via the through-hole 601 of the screw member 60 and the plurality of mutually communicating pores of the insertion member 64. Hence, the effect of reducing the abnormal discharge generated in the gas supply section 11 in the substrate fixing device 5 can further be improved in comparison to the substrate fixing device 1. Other advantageous features of effects obtainable in the substrate fixing device 5 are similar to those obtainable in the substrate fixing device 1.

Sixth Embodiment

In an example of the substrate fixing device according to a sixth embodiment, an insertion member is provided separately from the screw member. In the sixth embodiment, those constituent parts that are the same as those of the embodiments described above may be omitted.

Figure 8A:
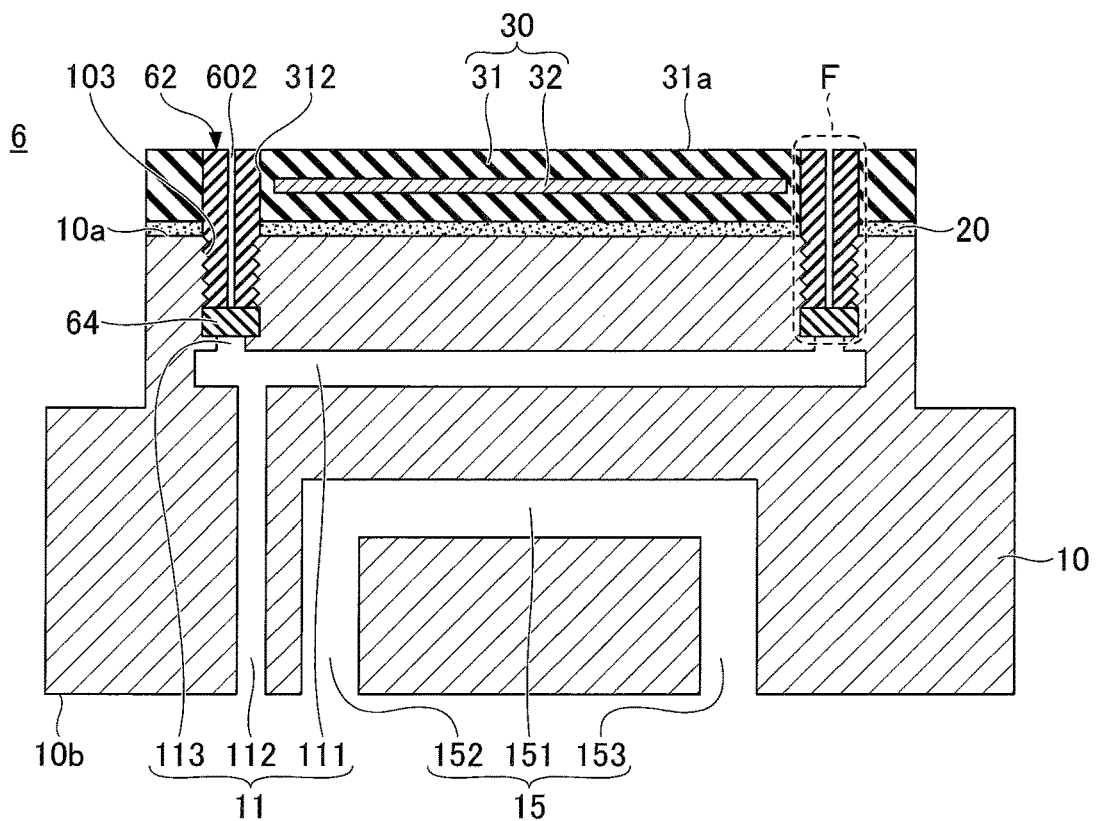
FIG. 8A and FIG. 8B are cross sectional views schematically illustrating an example of the substrate fixing device according to a sixth embodiment.
Figure 8B:
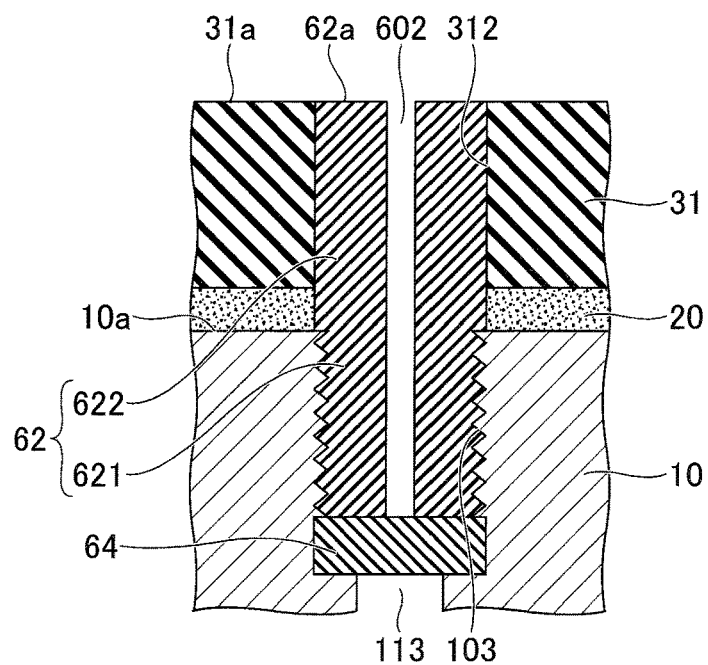

FIG. 8A and FIG. 8B are cross sectional views schematically illustrating the example of the substrate fixing device according to the sixth embodiment. FIG. 8A illustrates the entire substrate fixing device, and FIG. 8B is a partial enlarged view of a section F illustrated in FIG. 8A. As illustrated in FIG. 8A and FIG. 8B, a substrate fixing device 6 differs from the substrate fixing device 3 illustrated in FIG. 5A and FIG. 5B, in that the insertion member 64 is additionally provided in a recess 103.

The recess 103, that has an open end in communication with the insertion hole 312 and a bottom surface exposing the other end of the gas exhaust portion 113, is provided in the upper surface 10a of the base plate 10 at a position corresponding to each gas exhaust portion 113. The recess 103 may have a planar shape that is a circular shape having an inner diameter of approximately 2 mm to approximately 5 mm, for example. The recess 103 may be formed by drilling or laser machining, for example. An inner surface defining the recess 103, on the side of the adhesive layer 20, may be threaded to form a female thread. On the other hand, the inner surface defining the recess 103, on the bottom surface side (side opposite to the side of the adhesive layer 20), is not threaded.

The insertion member 64 is inserted into a non-threaded region on the bottom surface side of the recess 103, but is not fixed therein. The side surface of the insertion member 64 and the inner surface defining the recess 103 may make contact with each other, or a slight clearance may be provided therebetween.

After inserting the insertion member 64 into the recess 103, the screw member 62 is screwed into the insertion hole 312 and the threaded region of the recess 103 that communicates with the insertion hole 312, to assume the mated state. For this reason, the insertion member 64 will not fall out of the recess 103.

As described above, the abnormal discharge may be generated in the gas supply section 11 when the diameter of the hole opening at the mounting surface 31a of the base 31 is large.

In the substrate fixing device 6, the screw member 62, including the through-hole 602 having the diameter of 0.1 mm or less, is screwed into the insertion hole 311 and the recess 103 and fixed therein, similar to the substrate fixing device 3. Further, the insertion member 64, formed by the porous body, is inserted to make contact with the screw member 62, on the side of the screw member 62 at the lower surface 10b of the base plate 10. The gas from the gas supply section 11 is supplied to the mounting surface 31a of the base 31 via the through-hole 602 of the screw member 62 and the plurality of mutually communicating pores of the insertion member 64. Hence, the effect of reducing the abnormal discharge generated in the gas supply section 11 in the substrate fixing device 6 can further be improved in comparison to the substrate fixing device 3. Other advantageous features of effects obtainable in the substrate fixing device 6 are similar to those obtainable in the substrate fixing device 3.

According to each of the embodiments described above, it is possible to provide a substrate fixing device employing countermeasures against the abnormal discharge that enable easy maintenance.

Although the embodiments are numbered with, for example, "first," "second," "third," "fourth," "fifth," or "sixth," the ordinal numbers do not imply priorities of the embodiments. Many other variations and modifications will be apparent to those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

The target to be held by the electrostatic attraction using the substrate fixing device according to each of the embodiments is not limited to a semiconductor wafer (or silicon wafer or the like). For example, the target to be held by the electrostatic attraction using the substrate fixing device may be a glass substrate or the like used during a manufacturing process of a liquid crystal panel or the like.

What is claimed is:

1. A substrate fixing device comprising:
a base plate including therein a gas supply section; and
an electrostatic chuck provided on the base plate,
wherein the electrostatic chuck includes
a base having a mounting surface on which a target to be held by electrostatic attraction is mounted,
an insertion hole, penetrating the base, having an inner surface that defines the insertion hole and is threaded to form a female thread, and
a first screw member, having an outer surface that is threaded to form a male thread, and inserted into the insertion hole to assume a mated state in which the male thread mates with the female thread and the first screw member extends for an entire length of the insertion hole,
wherein a gas from the gas supply section is supplied to the mounting surface via the first screw member.

2. The substrate fixing device as claimed in claim 1, wherein
the first screw member includes a through-hole having a first end opening at the mounting surface, a second end, opposite to the first end, in communication with the gas supply section, and a diameter of 0.1 mm or less, and
the gas from the gas supply section is supplied to the mounting surface via the through-hole.

3. The substrate fixing device as claimed in claim 1, wherein
the first screw member is formed by a porous body including a plurality of mutually communicating pores, and
the gas from the gas supply section is supplied to the mounting surface via the plurality of mutually communicating pores.

4. The substrate fixing device as claimed in claim 1, wherein the electrostatic chuck includes a second screw member, inserted into the base plate on a side of the first screw member, and making contact with the first screw member, wherein the first screw member includes a through-hole having a first end opening at the mounting surface, a second end, opposite to the first end, opening on the side of the second screw member, and a diameter of 0.1 mm or less, the second screw member is formed by a porous body including a plurality of mutually communicating pores, and the gas from the gas supply section is supplied to the mounting surface via the through-hole and the plurality of mutually communicating pores.

5. The substrate fixing device as claimed in claim 1, wherein the first screw member includes, in a portion exposed at the mounting surface, a structure that enables the first screw member to be turned.

6. The substrate fixing device as claimed in claim 1, wherein the first screw member is made of a material including aluminum oxide or aluminum nitride.

7. A substrate fixing device comprising:
a base plate including therein a gas supply section; and
an electrostatic chuck provided on the base plate,
wherein the electrostatic chuck includes
a base having a mounting surface on which a target to be held by electrostatic attraction is mounted,
an insertion hole penetrating the base, and
a first screw member having an outer surface that is threaded to form a male thread on a side of the base plate,
wherein the base plate includes a recess, in communication with the insertion hole, and defined by an inner surface that is threaded to form a female thread,
wherein the first screw member is inserted into the insertion hole and the recess to assume a mated state in which the male thread mates with the female thread and the first screw member extends for an entire length of the insertion hole,
wherein a gas from the gas supply section is supplied to the mounting surface via the first screw member.

8. The substrate fixing device as claimed in claim 7, wherein
the first screw member includes a through-hole having a first end opening at the mounting surface, a second end, opposite to the first end, in communication with the gas supply section, and a diameter of 0.1 mm or less, and the gas from the gas supply section is supplied to the mounting surface via the through-hole.

9. The substrate fixing device as claimed in claim 7, wherein
the first screw member is formed by a porous body including a plurality of mutually communicating pores, and the gas from the gas supply section is supplied to the mounting surface via the plurality of mutually communicating pores.

10. The substrate fixing device as claimed in claim 7, wherein the electrostatic chuck includes
a second screw member, inserted into the base plate on a side of the first screw member, and making contact with the first screw member, wherein the first screw member includes a through-hole having a first end opening at the mounting surface, a second end, opposite to the first end, opening on the side of the second screw member, and a diameter of 0.1 mm or less, the second screw member is formed by a porous body including a plurality of mutually communicating pores, and the gas from the gas supply section is supplied to the mounting surface via the through-hole and the plurality of mutually communicating pores.

11. The substrate fixing device as claimed in claim 7, wherein the first screw member includes, in a portion exposed at the mounting surface, a structure that enables the first screw member to be turned.

12. The substrate fixing device as claimed in claim 7, wherein the first screw member is made of a material including aluminum oxide or aluminum nitride.

13. The substrate fixing device as claimed in claim 1, wherein one end surface of the first screw member coincides with the mounting surface of the base.

14. The substrate fixing device as claimed in claim 1, wherein the first screw member is replaceable with respect to the base.

15. The substrate fixing device as claimed in claim 7, wherein one end surface of the first screw member coincides with the mounting surface of the base.

16. The substrate fixing device as claimed in claim 7, wherein the first screw member is replaceable with respect to the base.

* * * * *